(12) United States Patent
Marks et al.

(10) Patent No.: US 7,633,130 B2
(45) Date of Patent: Dec. 15, 2009

(54) HIGH-PERFORMANCE FIELD EFFECT TRANSISTORS WITH SELF-ASSEMBLED NANODIELECTRICS

(75) Inventors: Tobin J. Marks, Evanston, IL (US); Peide Ye, West Lafayette, IN (US); Antonio Facchetti, Chicago, IL (US); Gang Lu, Midland, MI (US); Han Chung Lin, West Lafayette, IN (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 11/725,350

(22) Filed: Mar. 19, 2007

(65) Prior Publication Data
US 2007/0284629 A1 Dec. 13, 2007

Related U.S. Application Data

(60) Provisional application No. 60/784,062, filed on Mar. 17, 2006.

(51) Int. Cl.
*H01L 29/76* (2006.01)

(52) U.S. Cl. .................. 257/411; 257/40; 257/289; 257/E29.255

(58) Field of Classification Search .................. 257/411, 257/E29.255
See application file for complete search history.

(56) References Cited

U.S. PATENT DOCUMENTS

| 5,294,820 | A | 3/1994 | Gemma et al. |
| 5,554,220 | A * | 9/1996 | Forrest et al. .................. 117/88 |
| 6,617,609 | B2 | 9/2003 | Kelley et al. |
| 2002/0058367 | A1 * | 5/2002 | Hsu ........................... 438/175 |
| 2004/0079943 | A1 * | 4/2004 | Kimura ........................ 257/66 |
| 2005/0127337 | A1 * | 6/2005 | Marks et al. ................. 252/586 |
| 2006/0172219 | A1 * | 8/2006 | Stasiak et al. ............... 430/117 |
| 2006/0284166 | A1 * | 12/2006 | Chua et al. .................... 257/40 |
| 2008/0017854 | A1 * | 1/2008 | Marks et al. ................... 257/43 |

OTHER PUBLICATIONS

Yoon et al. Sigma-Pi molecular dielectric multilayers for low-voltage organic thin-film transistors. Proceedings of the National Academy of Sciences Mar. 29, 2005 vol. 102, No. 13, 4678-4682.

* cited by examiner

*Primary Examiner*—Tu-Tu V Ho
(74) *Attorney, Agent, or Firm*—Reinhart Boerner Van Deuren s.c.

(57) ABSTRACT

Field effect transistor devices comprising III-V semiconductors and organic gate dielectric materials, such dielectric materials as can afford flexibility in device design and fabrication.

25 Claims, 10 Drawing Sheets

HIGH-PERFORMANCE FIELD EFFECT TRANSISTORS WITH SELF-ASSEMBLED NANODIELECTRICS

Figure 1:
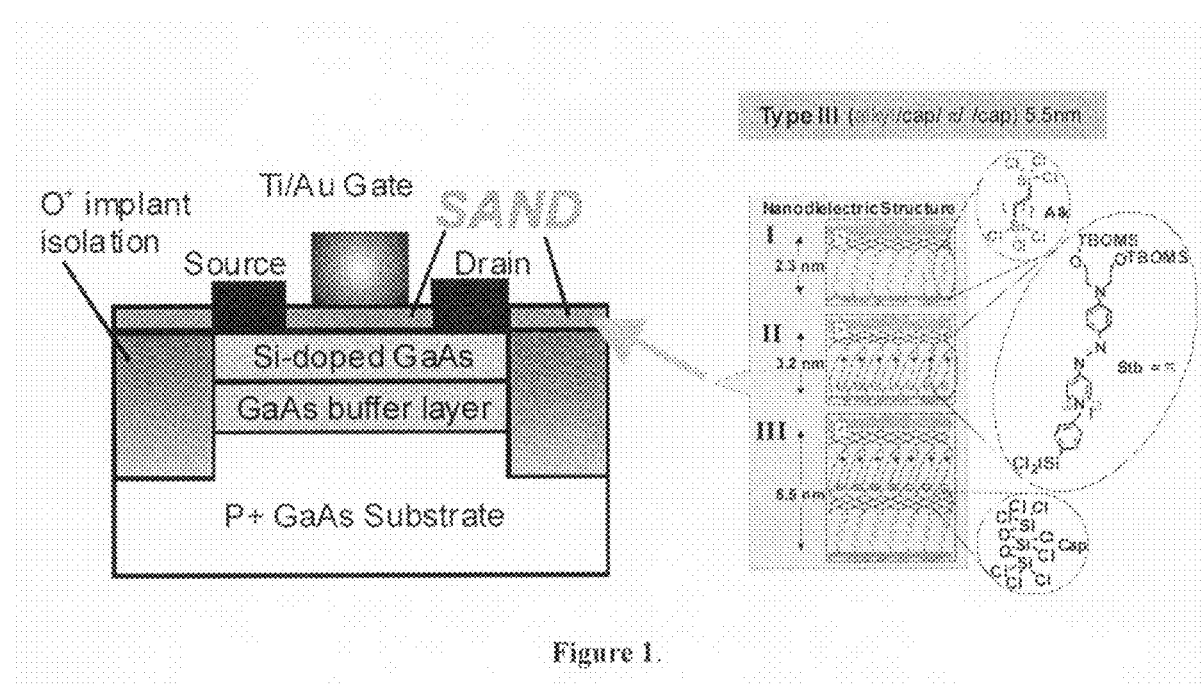

This application claims priority benefit of application Ser. No. 60/784,062 filed Mar. 17, 2006, the entirety of which is incorporated herein by reference.

The United States Government has certain rights to this invention pursuant to Grant Nos. NCC2-1363 and W911NF-05-0187 from NASA and DARPA/ARO respectively, to Northwestern University.

BACKGROUND OF THE INVENTION

MOSFETs and MISFETs (metal-insulator-semiconductor field effect transistors) have been the subject of intense study for several decades. Heterogeneous integration of novel dielectrics and novel channel materials has recently gained increasing attention as a necessity to further drive Si complementary metal-oxide semiconductor (CMOS) integration, functional density, speed and power dissipation, and to extend CMOS front-end fabrication to and beyond the 22 nm node. Using III-V compound semiconductors as conduction channels, to replace traditional Si or strained Si, is currently an active research frontier due to the excellent electrical properties of III-V compound semiconductors and the existence of a viable III-V industry for more than 30 years.

The principal obstacle to III-V compound semiconductors rivaling or exceeding the properties of Si electronics has been the lack of high-quality, thermodynamically stable insulators on GaAs (or on III-V materials in general) that equal the outstanding properties of $SiO_2$ on Si, e.g., a mid-band gap interface-trap density $(D_{it})$ of $\sim 10^{10}/cm^2$ eV. For decades, the research community has searched for suitable III-V compound semiconductor gate dielectrics or passivation layers. The literature testifies to the extent of this effort, with representative, currently active approaches including sulfur passivation, silicon interface control layers (Si ICLs), in situ molecular beam epitaxy (MBE) growth of $Ga_2O_3(Gd_2O_3)$, ex situ atomic layer deposition (ALD) growth of $Al_2O_3$ and $HfO_2$, wet oxidation of InAlP, jet vapor deposition of $Si_3N_4$, and ALD or PVD of $HfO_2$+Si ICL. Nonetheless, such techniques are somewhat difficult to implement, tend to be relatively expensive and provide little compositional or fabrication flexibility. As a result, the search for useful gate dielectric materials remains an on-going concern in the art.

SUMMARY OF THE INVENTION

In light of the foregoing, it is an object of the present invention to provide various field effect transistor devices and/or component structures, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to anyone aspect of this invention.

It is an object of the present invention to provide a class of stable insulating, dielectric materials to better take advantage of the electrical properties available through use of Group III-V semiconductors.

It can be another object of the present invention to provide such materials with synthetic and/or compositional flexibility of the sort suitable for a range of such Group III-V semiconductors.

In conjunction with one or more of the preceding objectives, it is an object of the present invention to provide an approach to gate dielectrics distinguishable over the prior art, as can be incorporated into GaAs MISFETs and other structurally- and/or compositionally-related device structures, such objective as can be met using thin self-assembled nanodielectrics (SANDs) of the type including those described below.

Other objects, features, benefits and advantages of the present invention will be apparent from this summary and the following descriptions of certain embodiments, and will be readily apparent to those skilled in the art having knowledge of various transistor devices and assembly/fabrication techniques. Such objects, features, benefits and advantages will be apparent from the above as taken into conjunction with the accompanying examples, data, figures and reasonable inferences to be drawn therefrom, alone or with consideration of the references incorporated herein.

In part, the present invention can be directed to a field effect transistor device comprising a Group III-V semiconductor and a gate coupled thereto, such a gate comprising an organic dielectric component and/or compound or composition comprising at least two of a hydrocarbon moiety, a siloxane moiety and a π-polarizable moiety. Such dielectric components would be understood by those in the art made aware of this invention and can be prepared through self-assembly from available starting materials. From a structural-functional perspective, described more fully below, such a component can comprise one or more self-assembled components or iterations thereof providing and/or contributing to higher dielectric strength and improved insulating capabilities. As used herein, "coupled" can refer to a simple, physical adherence of two materials or components without forming any chemical bonds (e.g., without limitation, by absorption), as well as the formation of one or more chemical bonds (e.g., ionic or covalent bonds) between two or more chemical moieties, atoms or molecules.

Regardless, a dielectric component of this invention can comprise one or more π-polarizable moieties and/or one or more hydrocarbon moieties cross-linked with a siloxane bond sequence. In certain embodiments, such a dielectric component can comprise a hydrocarbon or a fluoro-substituted hydrocarbon moiety coupled with silicon-oxygen bonds to such a π-polarizable moiety. In certain other embodiments, such a dielectric component can comprise another siloxane moiety coupled to such the π-polarizable moieties, with silicon-oxygen bonds. Regarding such embodiments, a siloxane moiety can be positioned between a π-polarizable moiety and a hydrocarbon moiety, coupled to each with silicon-oxygen bonds. Such moieties and compounds or molecular components comprising such moieties include but are not limited to those described more fully in co-pending application Ser. No. 11/181,132, filed Jul. 14, 2005, the entirety of which is incorporated herein by reference.

Such a silicon-oxygen bonding sequence can be the condensation product of a hydrolyzable silicon moiety (e.g., without limitation, a halogenated, amidated alkoxylated and/or carboxylated silyl moiety) and a hydroxyl functionality. As understood in the art and explained more fully in one or more of the references incorporated herein, such a bonding sequence can derive from use of starting material compounds for the respective dielectric components or moieties, such compounds substituted with one or more hydrolyzable silicon moieties, hydrolysis of such a moiety under self-assembly conditions, and condensation with a subsequent layer starting material or precursor compound.

In certain non-limiting embodiments, a dielectric component can include a multi-layered organic assembly/composition comprising iterations or periodically alternating layers of different materials. These alternating layers can include one or more layers that comprise a π-polarizable moiety (e.g., "a chromophore layer"), and one or more layers that comprise a hydrocarbon and/or a fluorosubstituted hydrocarbon moiety ("hydrocarbon"). At least some of the alternating layers can be coupled by a coupling or capping layer that includes a siloxane matrix (e.g., "a siloxane layer").

Regardless, in certain embodiments, such a dielectric component can comprise a moiety comprising conjugated π-electrons. In certain such embodiments, such a moiety can comprise at least one of a dipole moment, an electron releasing moiety, an electron withdrawing moiety, a combination of such moieties, a zwitterion and a net charge. Without limitation, such a component can comprise either a π-conjugated organic chromophore or a non-linear optical chromophore. In some embodiments, such a chromophore can comprise a π-conjugated system, which can include a system of atoms covalently bonded with alternating single and multiple (e.g., double) bonds (e.g., C=C—C=C—C and C=C—N=N—C). The π-conjugated system can include heteroatoms such as, but not limited to, nitrogen (N), oxygen (O), and sulfur (S). In some embodiments, the π-conjugated system can include one or more aromatic rings (aryl or heteroaryl) linked by conjugated hydrocarbon chains. In certain embodiments, the aromatic rings can be linked by conjugated chains that include heteroatoms (e.g., azo groups [—N=N—]). For example, such a chromophore can comprise a stilbazolium (Stb) moiety. The identity of such compounds is limited only by their electronic/structural features and resulting polarizability in the context of a particular use or application, as illustrated by various representative embodiments described herein and by way of the incorporated references. Such a component can be utilized in conjunction with a hydrocarbon (or fluorocarbon) moiety comprising an alkyl moiety ranging from about $C_4$ to about $C_{10}$. Optionally, a dielectric component of this invention can further comprise a siloxane moiety coupled to a π-polarizable moiety component and a hydrocarbon moiety. Such a siloxane moiety can comprise one or more Si—O—Si bond sequences, each of which can be coupled one to another with silicon-oxygen bonds.

Regardless, a hydrocarbon layer can comprise or derive from a bis(silylated) alkyl moiety or a bis(silylated) fluorosubstituted alkyl moiety (e.g., ranging from about $C_1$ to about $C_{20}$). In particular embodiments, the hydrocarbon layers can be coupled to the chromophore layers directly or via a coupling or capping layer that includes a siloxane matrix. The coupling can be performed via a condensation reaction or chemisorption using known silyl chemistry. For example, precursors of the silyl alkyl (or fluorosubstituted alkyl) moiety and the siloxane moiety can include hydrolyzable groups such as, but not limited to, halo groups, amino groups (e.g., dialkylamino groups), and alkoxy groups. Examples of such precursors can include, but are not limited to, $Cl_3Si(CH_2)_nSiCl_3$, $(CH_3O)_3Si(CH_2)_nSi(OCH_3)_3$, and $(Me_2N)_3Si(CH_2)_nSi(NMe_2)_3$, together with various monofluorosubstituted, (CHF) and difluorosubstituted (CF$_2$) analogs thereof, where n can be an integer in the range of 1-about 10 (i.e., n can be 1, 2, 3, 4, 5, 6, 7, 8, 9, or 10). As discussed more fully herein, such groups are hydrolyzable to a degree sufficient for substrate sorption or condensation or intermolecular crosslinking via siloxane bond formation under the processing or fabrication conditions employed. Similarly, the π-polarizable moiety can be derivatized to include similar silyl hydrolyzable groups, to allow bond formation with the siloxane capping layer and/or the organic layer. In particular embodiments, the organic layers and the chromophore layers can be individually self-assembled monolayers that include the silyl or siloxane moiety, or the π-polarizable moiety.

Precursor compounds of the sort which can be incorporated into such compositions include, for instance, bis-trichlorosilyloctane, octachlorotrisiloxane and 4-[[(4-(N,N-bis((hydroxy)ethyl)amino]-phenyl]azo]-1-(4-trichlorosilyl)benzyl-pyridinium iodide—which, when condensed one with another, provide a corresponding layered dielectric assembly, in accordance with this invention. Without limitation, condensation of any two such precursors or combinations thereof can provide a representative dielectric composition. (See, e.g., FIG. 1 and dielectrics I-III.) Alternatively, as a further illustration of the component-by-component, layer-by-layer approach available herewith, such compositions can comprise one or more combinations of such condensation products (e.g., III+I, a bis(silyl)alkyl/siloxane/π-polarizable/siloxane and bis(silyl)alkyl/siloxane combination; or II+III, a π-polarizable/siloxane and bis(silyl)alkyl/siloxane/π-polarizable/siloxane combination, etc.) or iterations thereof (e.g., $I_n$, $II_n$ or $III_n$, where n>1), such combinations and iterations limited only by starting material and reaction sequence.

While several of the aforementioned dielectric components, compounds, layers and moieties are illustrated in the aforementioned incorporated reference, various other component compounds and associated moieties are contemplated within the scope of this invention, as would be understood by those skilled in the art made aware thereof. For instance, without limitation, various other π-polarizable components and associated moieties are described in U.S. Pat. No. 6,855,274, in particular the NLO structures of FIGS. 1-2, 11, 13 and 15 thereof, U.S. Pat. No. 6,549,685, in particular FIGS. 2-3 thereof, and U.S. Pat. No. 5,156,918, in particular the structures of FIGS. 4-5 thereof, each with reference to the corresponding specification regarding alternate embodiments synthesis and characterization, each of which is incorporated herein by reference in its entirety. Further, as would be understood by those skilled in the art, various other non-linear optical chromophore components are described in "Supramolecular Approaches to Second-Order Nonlinear Optical Materials. Self-Assembly and Microstructural Characterization of Intrinsically Acentric [(Aminophenyl)azo]pyridinium Superlattices", Journal of American Chemical Society, 1996, 118, 8034-8042, which is hereby incorporated by reference in its entirety. Such components can be used, as described herein, with a variety of difunctionalized hydrocarbon and/or siloxane moieties or components, without limitation as to hydrocarbon length or degree of functionalization capable of condensation with a suitable substrate and/or various other dielectric components in accordance with this invention.

Likewise, as would be understood by those skilled in the art made aware of this invention, gate dielectrics useful in conjunction with devices of this invention can comprise one or more inorganic components on, connected with, adjacent and/or coupled to one or more of the present organic dielectric components or layers. Without limitation, such inorganic components can comprise $SiO_2$, $Si_3N_4$, $Al_2O_3$, $Ga_2O_3$, $Gd_2O_3$ and other standard inorganic dielectric materials known in the art, and $HfO_2$, $ZrO_2$, $Ta_2O_5$ and other high-k inorganic dielectric materials known in the art, and combinations of such standard and/or high-k dielectric components. In certain embodiments, an organic dielectric component of this invention can be on, under or between one or more inorganic components. For instance, without limitation, an organic component can be positioned between one or more standard inorganic dielectric components and one or more high-k inorganic dielectric components. In certain such embodiments, such an organic component can comprise one or more layers interfacing or as a transition between one or more standard inorganic layers and one or more high-k inorganic layers. Regardless, from a broader perspective, this invention can comprise any one, combination or order of such inorganic dielectric component(s) in conjunction with one or more organic dielectric components of this invention, such combinations and/or orders limited only by function afforded a corresponding Group III-V device.

Regardless of the design or composition of a gate dielectric component of this invention, a semiconductor can comprise any Group III-V material found to those skilled in the art of field effect transistor devices and related structures, made aware of this invention, such compounds limited only by desired electrical properties and/or the use in the fabrication of conduction channels for such devices and structures. In certain non-limiting embodiments, such a semiconductor can comprise GaAs, as illustrated below and representative of the use of such materials in conjunction with the present invention.

Consistent with various broader aspects of this invention, such a semiconductor can be selected from any Group III-V compound known in the art, including but not limited to GaAs, InP, InAs, InSb and GaP and combinations of such compounds. In other embodiments, such a semiconductor compound or material can comprise a dopant. In certain such embodiments, a Group III metal can be present as a dopant, and the corresponding Group III aspect of such a semiconductor can be of a formula $M^{III}_x M^{III}_{1-x}$ where M is independently selected from Group III metals and x is of a value reflecting an unlimited stoichiometric range. Without limitation, doped Group III-V compounds can include various $In_x Ga_{1-x}$ As materials. Regardless, in certain other embodiments, one or more Group III-V compounds can be provided in conjunction with one or more doped compounds, as illustrated herein. For instance, a semiconductor can comprise such a doped compound on, connected with, adjacent or coupled to a Group III-V compound. Without limitation, representative of various other embodiments of this invention, a semiconductor can comprise an $In_x Ga_{1-x}$ As component on or coupled to either a GaAs or a InP component.

In part, the present invention can also be directed to a range of composites, comprising such dielectric and semiconductor components, and related device structures. Such composites and devices can comprise Group III-V layers, components or substrates of the sort including but not limited to those described above, including but not limited to those having a hydroxylated surface portion or as can be treated to provide a hydroxyl functionality. Such layers, components and substrates include but are not limited to GaAs, and doped embodiments thereof, and other such materials recognized by those in the art. Corresponding composites comprising any of the organic dielectric components herein, alone or in combination with any one or more of the inorganic components described above, can be used in the fabrication of a wide range of field effect transistor (e.g., MISFET) device structures and corresponding gate dielectrics.

With respect to the devices, semiconductors and/or gate dielectrics of present invention, the components, layers and/or materials thereof can suitably comprise, consist of, or consist essentially of any of the aforementioned materials, compositions, compounds and/or moieties thereof. Each such component, layer, material, compound or moiety thereof can be compositionally distinguished, characteristically contrasted and can be practiced with injunction with the present invention separate and apart from another. Accordingly, it should also be understood that the inventive devices, semiconductors and/or gate dielectrics, as illustratively disclosed herein, can be practiced or utilized in the absence of anyone component, layer, material, compound and/or moiety which may or may not be disclosed, references or inferred, the absence of which may or may not be specifically disclosed, referenced, or inferred.

DETAILED DESCRIPTION OF THE DRAWINGS

FIG. 1. Schematic view of a depletion-mode n-channel GaAs MISFET (left) with self-assembled nanodielectrics (right) as the insulating layer. The SAND layers were sequentially deposited from solutions of precursors Alk, Stb, and Cap. (Type III)$_n$ SANDs (n=1(5.5 nm-thick), 3 (16.5 nm-thick)) are used for GaAs MISFET fabrication.

Figure 2:
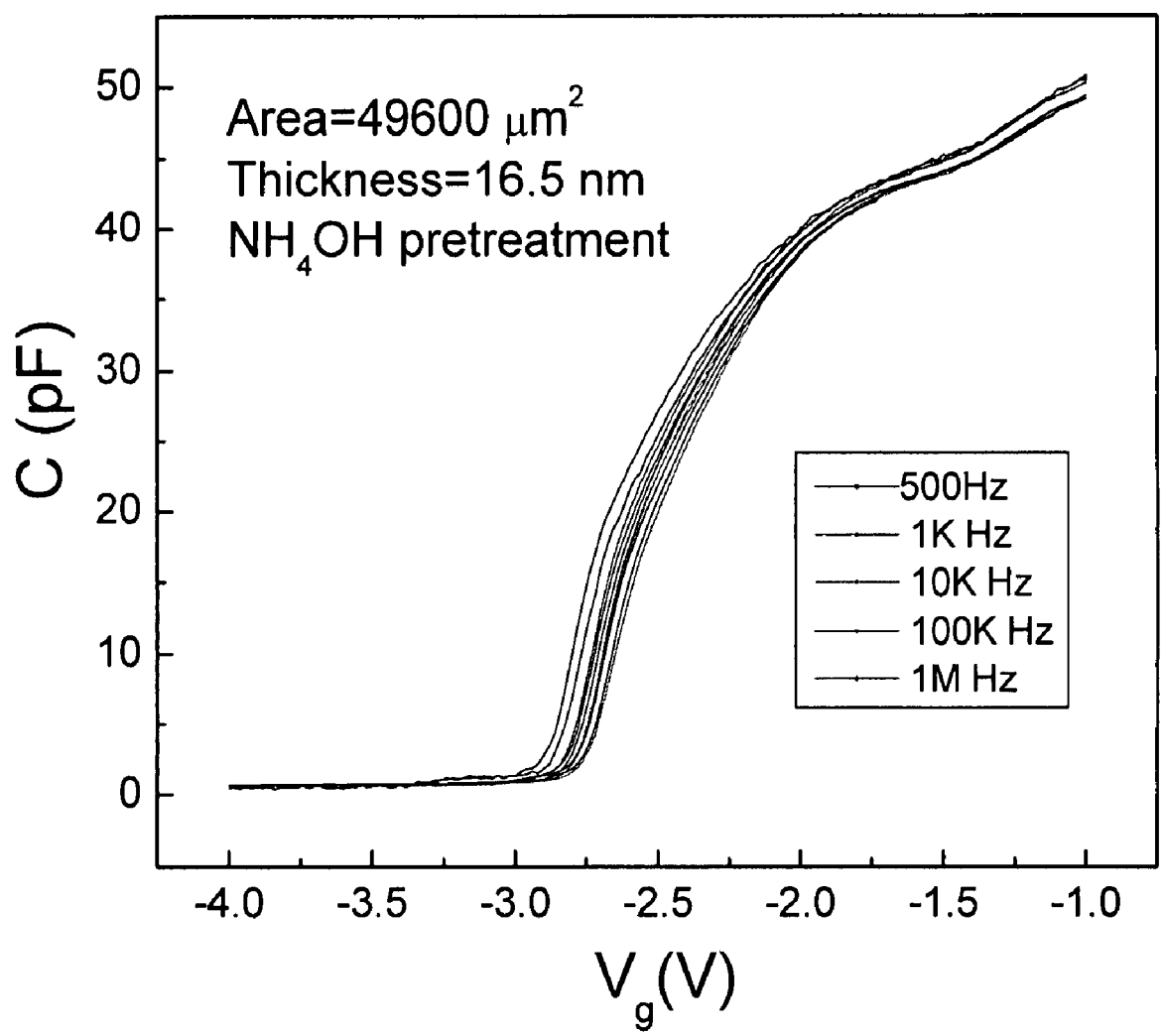

FIG. 2. C-V measurements on NH$_4$OH pretreated GaAs MISFET showing small hysteresis and frequency dispersion.

Figure 3:
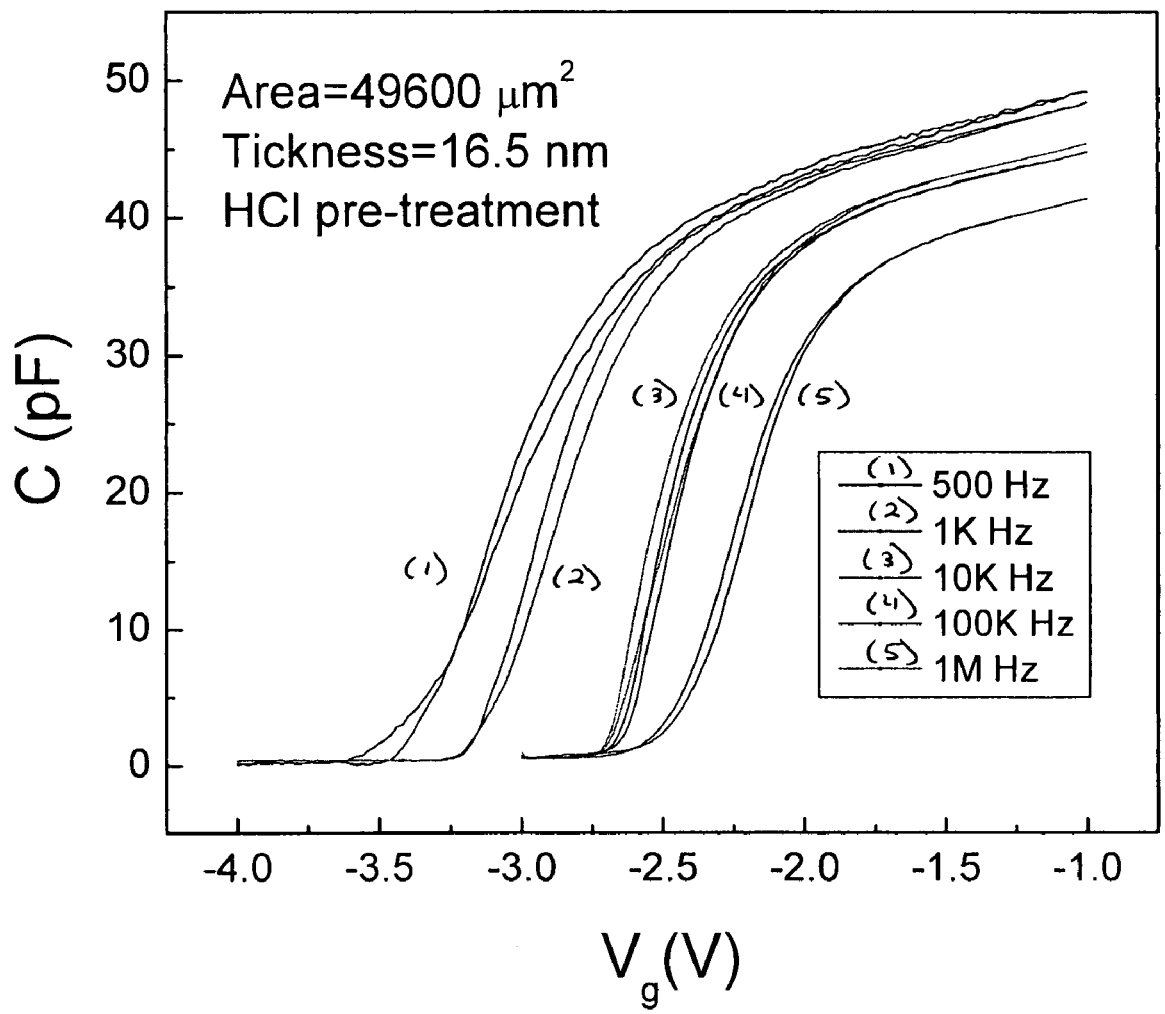

FIG. 3. C-V measurements on HCl pretreated GaAs MISFET showing significant frequency dispersions on flat band voltage and accumulation capacitance.

Figure 4:
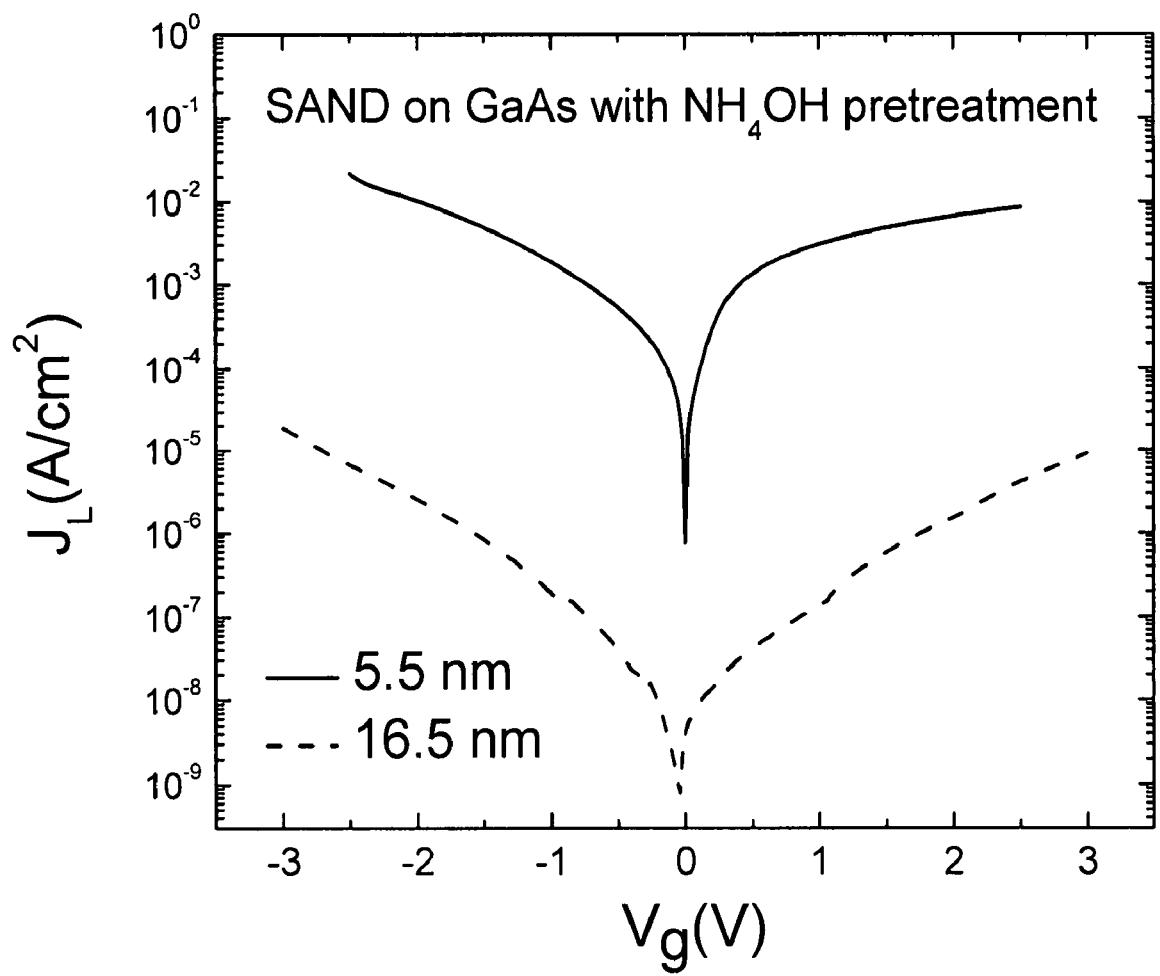

FIG. 4. Leakage current density J$_L$(A/cm2) versus gate bias Vg(V) with different SAND film thicknesses.

Figure 5:
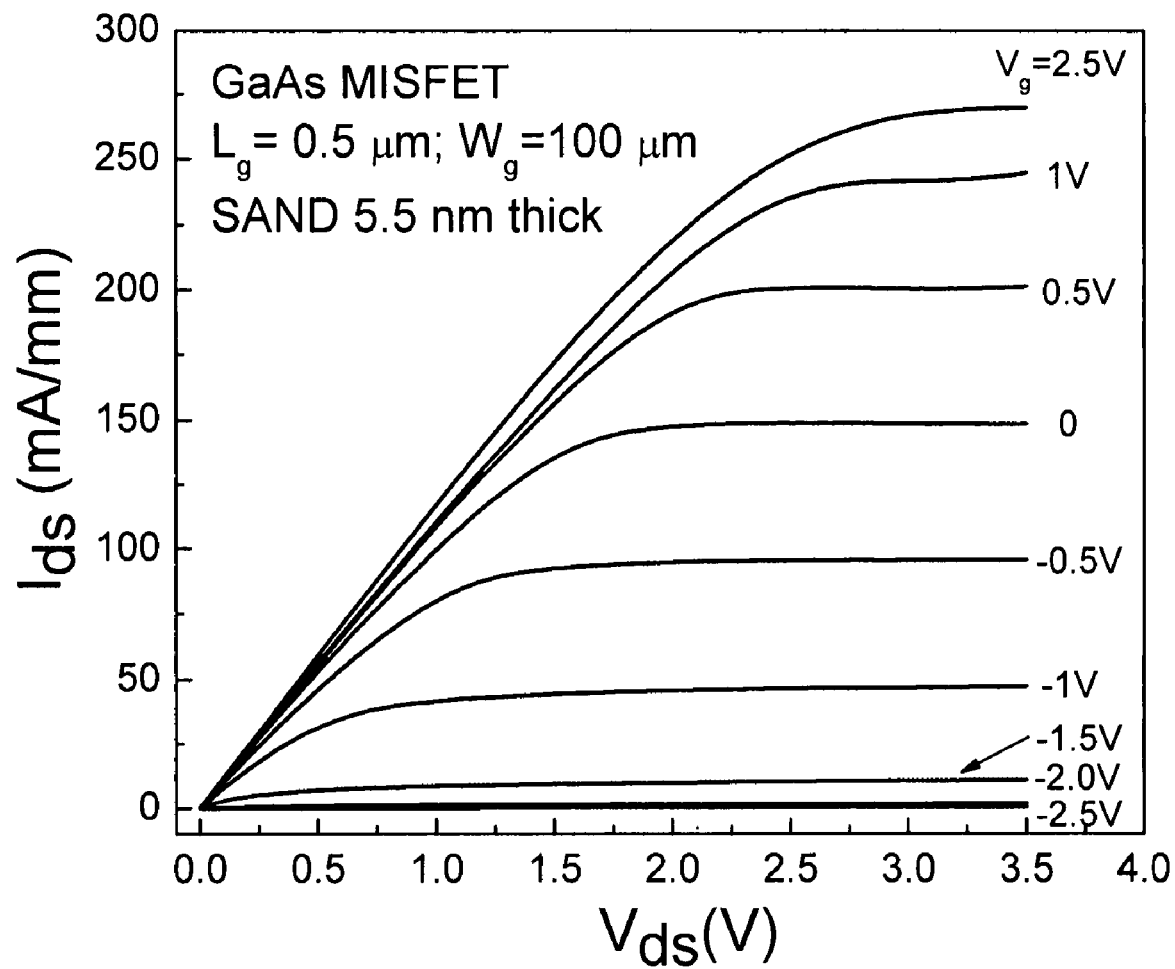

FIG. 5. Drain current versus drain bias as a function of gate bias for 0.5 μm GaAs MISFET with 5.5 nm SAND.

Figure 6:
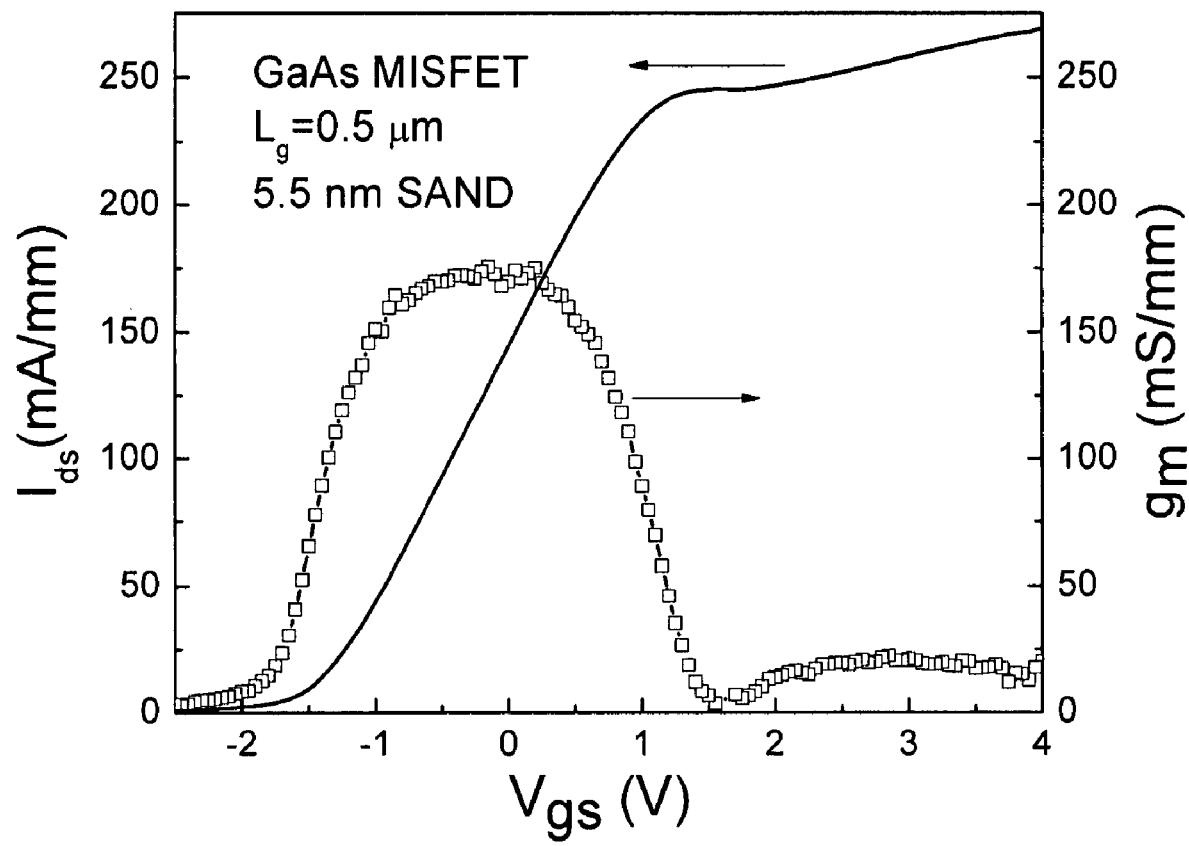

FIG. 6. Drain current versus gate bias (solid line) and intrinsic transconductance versus gate Bias (empty squares) at Vds=3.5V.

Figure 7:
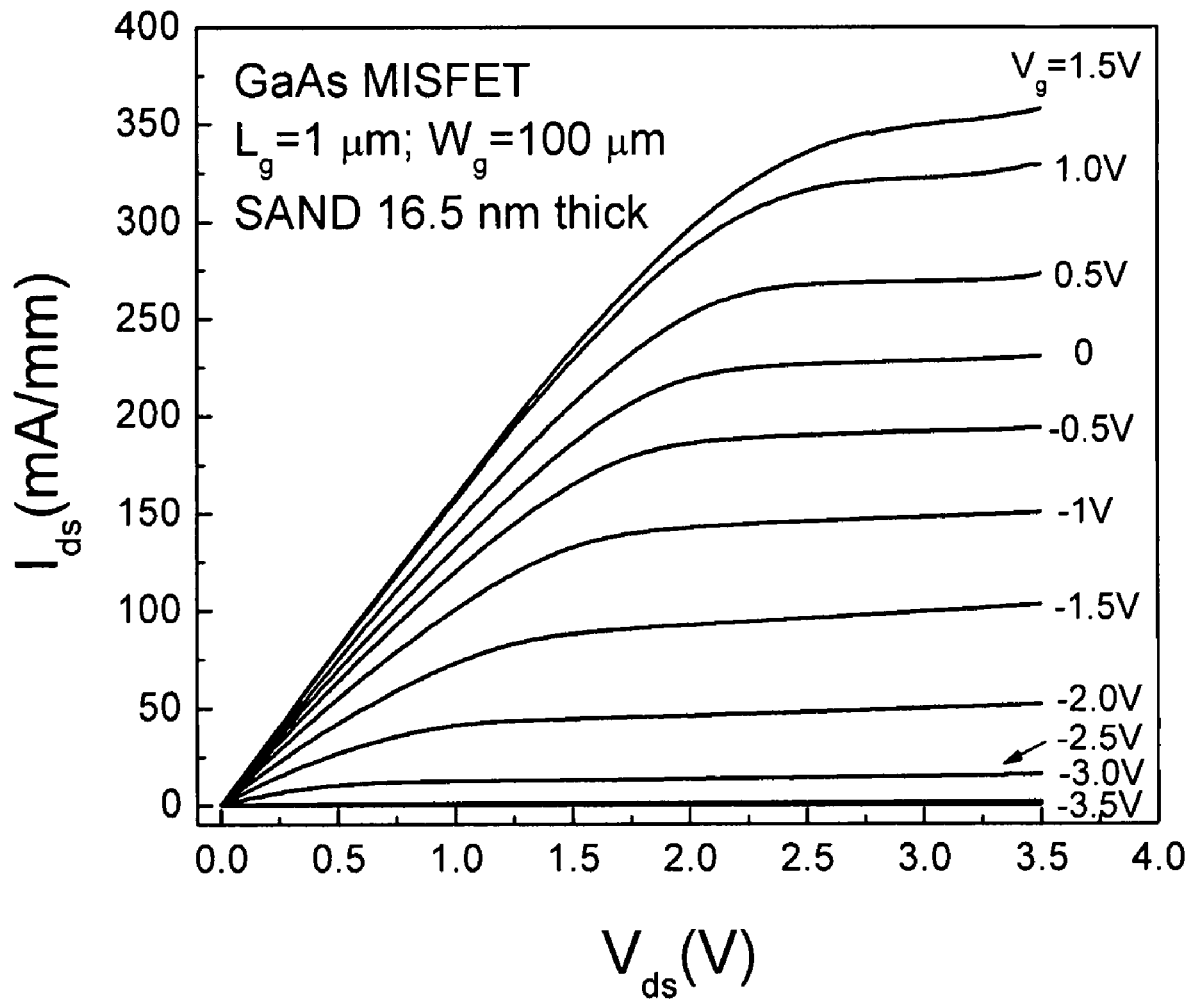

FIG. 7. Drain current versus drain bias as a function of gate bias for 1 μm GaAs MISFET with 16.5 nm SAND.

FIG. 8. (A)The excess 1/f noise spectra of a GaAs MISFET with SAND. The device has 100 μm*1 μm gates and was biased at 0.1IV, 0.2V and 0.3V on the drain and −3V on the gate. (B) Drain current versus the amplitude of current noise at f=100 Hz and a gate voltage of −3V.

Figure 9:
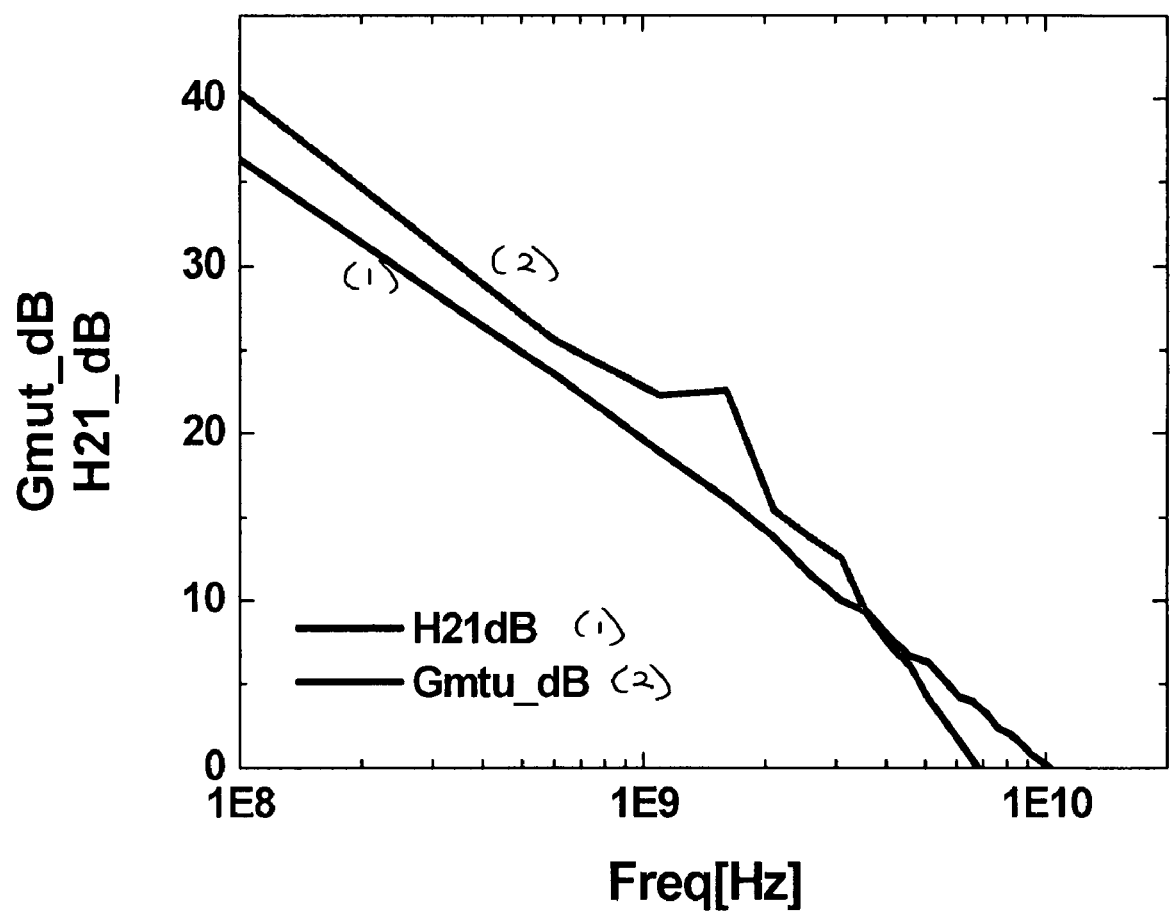

FIG. 9. The plot of H$_{21}$ as a function of frequency for a GaAs MISFET with a SAND thickness of 5 nm and a gate length of 1 μm at V$_{ds}$=3V and V$_g$=0.1V. The extracted unity gain frequency f$_T$ is 10.6 GHz.

DETAILED DESCRIPTION OF CERTAIN EMBODIMENTS

Representative of this invention, GaAs MISFETS exhibiting excellent performance can be fabricated under mild conditions using simple equipment and very thin biomembrane-like self-assembled nanodielectrics (SANDs) as the insulating layer. Primarily developed for enhancing the response of organic thin-film transistors (OTFTs), self-assembled organic gate dielectrics can be deposited at room temperature via layer-by-layer solution phase techniques using organosilane precursors. For instance, with reference to FIG. 1, a hydrocarbon moiety can be provided and/or deposited using a toluene solution of Cl$_3$Si(CH$_2$)$_8$SiCl$_3$ at 0° C., rinsing twice with toluene, sonicating in acetone-H$_2$O (95-5 v:v) solution for 3 min, then drying at 115° C. for ~5 min. A siloxane moiety can be assembled by immersing the hydrocarbon layer in a dry pentane solution of Si$_3$O$_2$Cl$_8$ (34 mM) for 30 min, washing twice with dry pentane, sonicating in acetone for 15 min, and drying at 115° C. for ~5 min. Such components can then be immersed in a dry THF solution of a Stbz chromophore precursor (1-2 mM) for ≧15 min at 60° C. After cooling to 25° C., the π-polarizable moiety can be washed with toluene and THF, sonicated in acetone for 5 min., and dried at 115° C. for ~5 min. Another siloxane moiety can be assembled as described above. Additional such examples and synthetic techniques are found in the aforementioned references, in particular the '274 and '685 patents. (See, also, M. H. Yoon, A. Facchetti, and T. J. Marks, Proc. Natl. Acad. Sci. U.S.A. 102, 4678 (2005); M. H. Yoon, H. Yan, A. Facchetti, and T. J. Marks, J. Am. Chem. Soc. 127, 10388 (2005). 142101-3 Lin, et al., Appl. Phys. Lett. 89, 142101 (2006), each of which is incorporated herein by reference.)

Such an approach yields smooth, nanostructurally well-defined, strongly adherent, thermally stable, virtually pin-hole-free, organosiloxane thin films exhibiting excellent insulating properties (leakage current densities as low as $10^{-9}$ A/cm$^2$ with native SiO$_2$ on Si), a large single Stb layer (e.g., FIG. 1) capacitance (up to ~0.025 pF/μm$^2$) and dielectric constant (k) up to ~16, enabling OTFT function at very low operating voltages. Such dielectric compositions exhibit good uniformity over areas as large as ~150 cm$^2$, are insoluble in common solvents, can be patterned using standard microelectronic etching methodologies, and adhere to/are compatible with a wide range of substrates. The results provided herein unambiguously demonstrate facile integration of SANDs with a wide range of III-V compound semiconductors.

Comparable results are available using inorganic dielectric components of the sort described above. Such inorganic dielectrics can be incorporated into device structures of the present invention using techniques well-known to those skilled in the art. For instance, such inorganic components can be provided or deposited using CVD, PECVD, PVD or ALD techniques of the sort reported in the literature, such techniques limited only by compatibility with an organic dielectric component and/or a self-assembly technique used in conjunction therewith. Without limitation, such an inorganic dielectric component can be grown using an ALD process at a temperature (e.g., about 25° C.-about 150° C.) above which would compromise the compositional or structural integrity of any organic dielectric component present.

Illustrating certain embodiments of this invention, reference is made to FIG. 1 and a non-limiting schematic GaAs MISFET device. For such a GaAs MISFET device (FIG. 1) a 700-900 Å Si-doped ($4 \times 10^{17}$/cm$^3$) GaAs layer was employed with as the channel a 1500 Å C-doped ($5 \times 10^{16}$/cm$^3$) GaAs buffer layer on a P+ GaAs substrate grown by metalorganic chemical vapor deposition (MOCVD). Device isolation was achieved by oxygen implantation. Activation annealing was performed at the same time as ohmic contact formation. Ohmic contacts were formed by e-beam deposition of Au/Ge/Au/Ni/Au structures and a lift-off process, followed by 400° C. annealing in an N$_2$ ambient. Prior to SAND deposition, hydrophilic or hydrophobic GaAs surfaces were prepared using NH$_4$OH or HCl pretreatments, respectively. The SAND growth process (see FIG. 1) was as follows: 5 mM Alk (i.e., a hydrocarbon) reagent in dry toluene at 0° C. in N$_2$ for 1 h; 34 mM Cap (i.e., a siloxane) reagent in dry pentane at 25° C. in N$_2$ for 25 min; 10 mM Stb (i.e., a π-polarizable component) reagent in dry tetrahydrofuran at 60° C. in N$_2$ for 15 min, followed by hydrolysis with acetone-H$_2$O solution to yield a 5.5-nm-thick type III SAND film (FIG. 1). Finally, conventional Ti/Au structures were deposited by e-beam evaporation, followed by lift-off to form the gate electrodes. The source-to-gate and the drain-to-gate spacings are ~1 μm. The sheet resistance and contact resistance are 1.5-2.5 kΩ/sq. (depending on the thickness of n channels) and 1.5 Ωmm, respectively, measured using a transmission length method (TLM). The gate lengths of the measured devices are 0.5 and 1 μm. The process requires four levels of lithography (alignment, isolation, ohmic and gate), all done using a contact printer.

Various other organic dielectric compositions, gate dielectrics and device structures can be prepared using synthetic techniques of the sort described above or straight-forward modifications thereof, depending upon precursor compound(s) and desired reaction sequence, as would be understood by those skilled in the art made aware of this invention. Likewise, such techniques or modifications thereof would be understood in view of any one or more of the aforementioned incorporated references and the synthetic procedures and fabrication methods described therein.

FIGS. 2 and 3 illustrate 500 Hz-1 MHz C-V measurements on MIS capacitors fabricated with type III SAND layers (FIG. 1) as the insulator in parallel with the MISFETs. The results demonstrate the importance of the GaAs surface pretreatment (NH$_4$OH vs HCl) on the SAND/GaAs interface quality. Larger frequency dependent flatband shifts, frequency dispersions at accumulation capacitances, and hysteresis are observed for HCl-pretreated devices as shown in FIG. 3. Conversely, the NH$_4$OH pretreatment producing a hydroxylated GaAs surface results in high quality SAND layers as demonstrated by the C-V measurements. Hydroxylated GaAs surfaces favor SAND chemisorption, hence passivation, since the Alk Si—Cl groups react with the GaAs surface OH groups to form strong, covalent bonds (see FIG. 1). The typical hysteresis observed in these devices as shown in FIG. 2 is less than 80 mV, corresponding to a slow trap density of about $2 \times 10^{11}$/cm$^2$ eV. Consequently, all of the MISFET I-V characteristics were measured on NH$_4$OH treated devices. The dielectric constant of the currently employed SAND is ~3-4 as obtained from C-V measurements. Different SAND variants having higher k values, different III-V surfaces, such as r-type or p-type GaAs, InGaAs, and GaN, different predeposition surface treatments and different device structures are contemplated within the broader scope of this invention.

FIG. 4 shows the gate leakage current density ($J_L$) versus gate bias ($V_g$) for SANDs deposited on hydroxylated GaAs with film thicknesses ranging from 5.5 nm [type III] to 16.5 nm [(Type III)$_3$]. The 16.5-nm-thick SAND is realized by three successive depositions of a 5.5-nm-thick type III SAND film (FIG. 1). The corresponding gate leakage current of a MISFET having a 1 μm gate length and a 100 μm gate width is very small, 10 pA-10 nA, which is at least six orders of magnitude smaller than the drain current. The dielectric strength of this organic film is as high as 6 MV/cm, comparable to conventional inorganic gate dielectrics such as SiO$_2$, Si$_3$N$_4$ or HfO$_2$. The small SAND leakage currents and large breakdown strengths are attributed to the heavily three dimensional cross-linked structures, containing dense arrays of strong Si—O bonds and polarizable π-electron spacers.

FIG. 5 shows the I-V characteristics for a 0.5 μm-gate-length GaAs MISFET with a 5.5-nm-thick type III SAND film. The 800-Å-thick MOCVD GaAs channel layer leads to a maximum drain current of 280 mA/mm with a pinch-off voltage of −2.5 V. A parasitic resistance of 4 Ωmm is obtained from the resistance of the mobility region in FIG. 5. The same number can also be calculated from the measured sheet resistance of 2.5 kΩ/sq. and contact resistance of 1.5 Ωmm from the TLM measurement, using a gate-source spacing of 1 μm. The maximum intrinsic transconductance, $g_m$, is ~170 mS/mm for $L_g$=0.5 μm as shown in FIG. 6. Such large transconductance values indicate that the interface trap densities are remarkably low. The I-V characteristics for a 1 μm-gate-length GaAs MISFET with a 16.5-nm-thick SAND are shown in FIG. 7.

The maximum drain current density at a forward gate bias of 2.0 V is increased to ~370 mA/mm by employing a 900-Å-thick MOCVD GaAs n-channel layer. The device is still cleanly pinched off at a gate bias of ~3.5 V, although the insulator layer is 16.5 nm thick. The maximum intrinsic transconductance is ~125 mS/mm by correcting for the parasite resistance of 3 Ωmm. Note that this result does not scale with dielectric thickness due to depletion-mode operation, interface trap density, and incomplete electron velocity saturation. The estimated electron mobility from the maximum transconductances measured on 20-μm-long channel devices is ~1875 cm²/V s, which is about a factor of 4-5 larger than the mobility in Si-based devices. The relatively large differences in drain current vs channel layer physical thickness, i.e., 370 vs 280 mA/mm for 900 vs 800 Å, is due to some depletion from C-doped (5–10¹⁶/cm³) p-type buffer layer on a P+ GaAs substrate.

Figure 8A:
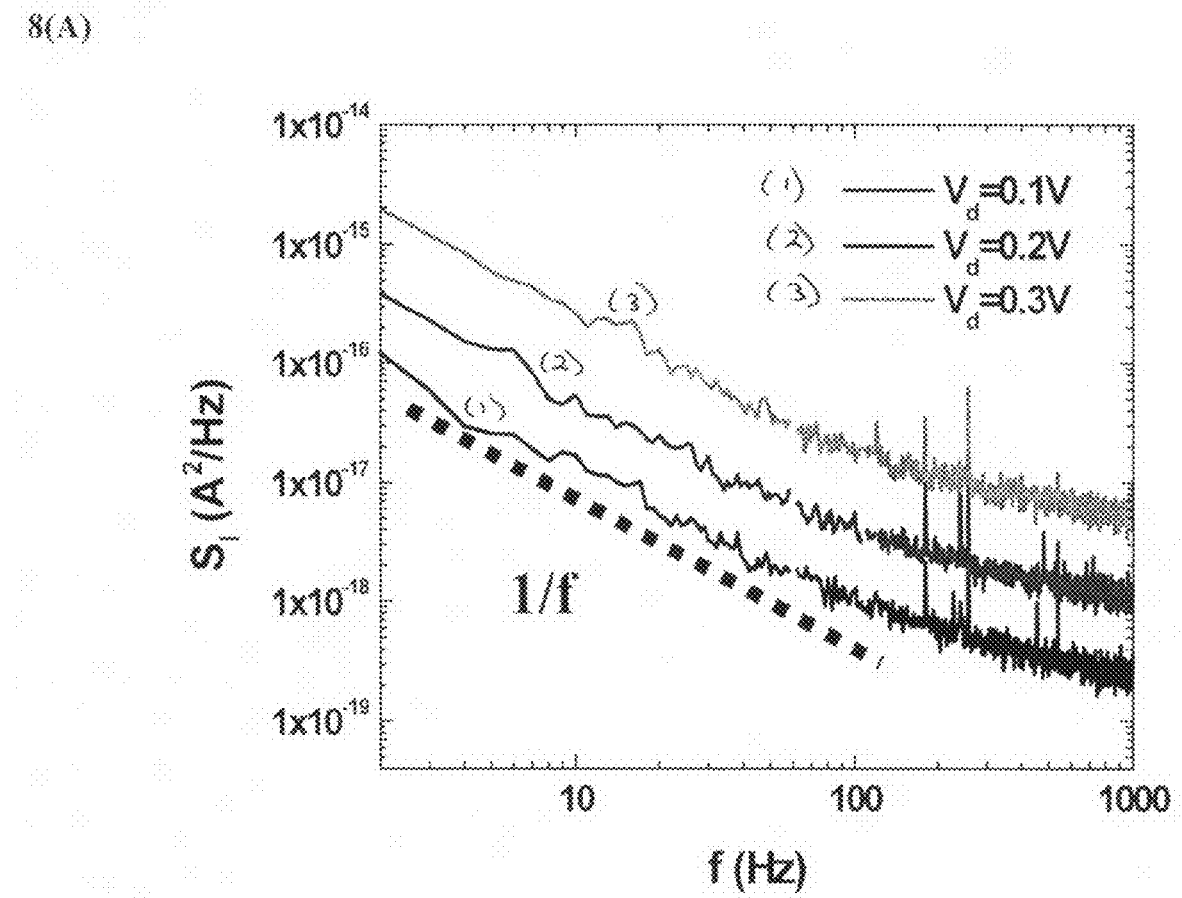

To evaluate the interface quality of a representative GaAs MISFET, the low frequency noise (1/f) spectrum density of the drain in transistor's linear operating condition was measured and extracted the value of Hooge's constant $\alpha_H$. A low frequency noise was swept in the frequency range from 1 Hz to 1 KHz with the source grounded. FIG. 8(A) shows that the drain current noise spectrum at a gate voltage of ~3V and drain voltages of 0.1V, 0.2V and 0.3V in the linear region of the $I_d$-$V_d$ curve. At a constant gate bias, the drain current noise spectrum varies as $f^\beta$, where β is close to 1 within 8%, and is therefore referred to as the 1/f noise.

As known in the art, the governing Hooge's equation of 1/f noise in a resistor is given by $$\frac{S_I(f)}{I_d^2} = \frac{S_R(f)}{R^2} = \frac{\alpha_H}{fN} \quad (1)$$

where N is the number of carriers, and $\alpha_H$ is a constant typically in the order of $10^{-3}$ in bulk materials. (F. N. Hooge, "1/f noise is no surface effect," *Phys. Lett.*, volA-29, p. 139, 1969.) The value of $\alpha_H$ can be used as parameter to compare interface trap in device regardless of the specific device parameters. For a MISFET channel operating in linear region, the drain current can be expressed as $$I_d = \frac{q\mu_{eff} N V_{ds}}{L^2} \quad (2)$$

The calculated maximum effective channel mobility for the MISFET with 16.5 nm SAND is 1890 cm²/V■s using the following formula $$\mu_{eff} = \frac{g_m L}{V_{ds} C_{ox} W} \quad (3)$$

where $C_{ox}$ is the oxide capacitance per unit area, L and W are the channel length and width, and $V_{ds}$ is the drain voltage. Combining (1) and (2), one can calculate the current fluctuation in a MISFET device operating in linear region as a function of drain current $$S_{Id}(f) = \frac{q\mu_{eff}\alpha_H I_d V_{ds}}{fL^2} \quad (4)$$

Figure 8B:
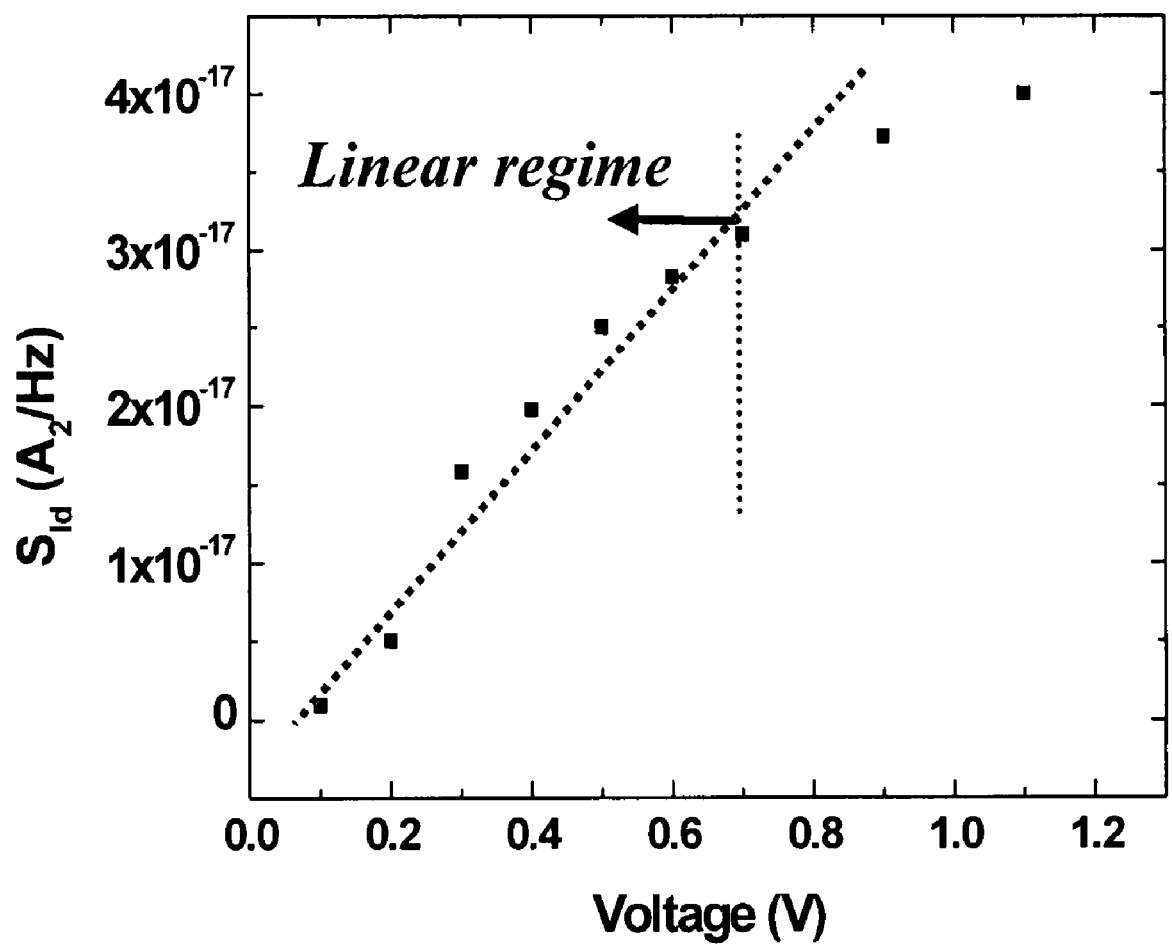

FIG. 8B shows the measured amplitude of current noise as a function of drain voltage $V_d$ at 100 Hz. The excess 1/f current noise spectrum of GaAs MISFET with SAND is linearly proportional to the drain voltage in the linear region. The extracted $\alpha_H$ is 2.6*10⁻⁴ for the 16.5 nm SAND GaAs MISFET $V_{gs}$=−3V. Table 1 shows $\alpha_H$ values of GaAs MISFET with SAND, compared with previously published data of metal gate/HfO MOSFETs and conventional NEC GaAs MESFETs and GaAs MESFET grown by M.B.E. The $\alpha_H$ value in our device is comparable with commercial GaAs MESFET devices which proves that SAND can be utilized as gate dielectrics, having good interface quality on GaAs substrate.

TABLE 1

| Devices | Hooge Parameter $\alpha_H$ |
| --- | --- |
| GaAs MESFET(1 μm * 300 μm)(M.B.E) | 7.6 * 10⁻⁵ |
| NEC MESFETs (NE244) | 5.6 * 10⁻⁵ |
| Metal gate/HfO MOSFET | 1 * 10⁻³ |
| GaAs MISFET with SAND | 2.6 * 10⁻⁴ |

The RF performance of GaAs MISFETs fabricated with SAND is also characterized with cut-off frequencies measured beyond 10 GHz. The RF characteristics are measured for a 1 μm-gate-length GaAs MISFET with 5nm-thick SAND in an ambient environment using an 8722D network analyzer and on-wafer probing technique. Devices are biased using bias tees and are measured up to 30 GHz. The RF calibration technique utilizes multiple averaging with SOLT standards. An open pad structure fabricated on the same substrate is also measured for de-embedding purposes. This type of RF measurement can be performed with sufficient accuracy only if the parasitic components of the transistor pads are carefully removed from the intrinsic transistor structure. To obtain the intrinsic $f_T$ and $f_{max}$ of GaAs MISFET with SAND, S-parameters of both device and probe pads are measured under different bias conditions and de-embedding is done according to a literature technique. (See, Ewout P. Vandamme, Dominique M. M.-P. Schreurs, and Cees van Dinther, "Improved three-step de-embedding method to accurately account for the influence of pad parasitics in silicon on-wafer RF test-structures," *IEEE Transactions on Electron Devices*, vol. 48, no. 4, pp. 737-742, 2001.)

The maximum cut-off frequency ($f_T$) and maximum oscillation frequency ($f_{max}$) are determined by varying the biasing condition. The maximum stable gain and current gain extracted from S-parameter under different bias conditions. FIG. 9 shows maximum $f_T$ and ($f_{max}$) achieved for 1 μm gate length GaAs MISFET device with 5.5 nm thick SAND under a bias of $V_{ds}$=3V and 0V<$V_{gs}$<0.1V A peak $f_T$ of 10.6 GHz and peak $f_{max}$ of 7.1 GHz are obtained, as shown in FIG. 9.

As shown above and in conjunction with the referenced figures, novel SAND nanodielectrics of this invention can be used for the fabrication of GaAs MISFETs exhibiting excellent transistor characteristics. These results suggest new opportunities for manipulating the complex GaAs surface chemistry with unprecedented materials options and using organic dielectrics for high-performance III-V semiconductor devices. The SAND components and related processes are flexible, low-cost, and far simpler to implement than previously reported MBE or ALD dielectric deposition techniques of the prior art. Additionally, in contrast to other device structures of the prior art, n-channel GaAs MISFET with a SAND component shows low gate leakage, small threshold voltage, and high breakdown voltage. Such results indicate that the dielectric components of this invention, as applied to field effect transistor devices provide good gate insulation for high-speed, high-power devices and provide great flexibility in design and fabrication.

We claim:

1. A field effect transistor device comprising a source, a drain, a gate positioned between said source and drain, a Group III-V semiconductor and a gate dielectric coupled thereto, said gate dielectric comprising an organic dielectric component comprising a condensation product of at least two of a siloxane moiety, a bis(silyl)alkyl compound and a π-polarizable moiety.

2. The device of claim 1 wherein said dielectric component comprises a condensation product of one of said π-polarizable moiety and bis(silyl)alkyl compound with a siloxane moiety.

3. The device of claim 2 wherein said π-polarizable moiety comprises a non-linear optical chromophore.

4. The device of claim 2 wherein said chromophore comprises a stilbazolium ion.

5. The device of claim 2 wherein said dielectric component is selected from the condensation product of a $C_4$- about $C_{10}$ bis(silyl)alkyl compound and a siloxane compound, the condensation product of a π-polarizable compound and a siloxane compound, and combinations of said condensation products.

6. The device of claim 5 wherein said dielectric component is selected from a condensation product of a $C_4$- about $C_{10}$ bis(silyl)alkyl compound and a trisiloxane compound, and a condensation product of a $C_4$- about $C_{10}$ bis(silylated) fluorosubstituted alkyl compound and a trisiloxane compound.

7. The device of claim 5 wherein said dielectric component comprises the condensation product of a silane-substituted stilbazolium compound and a trisiloxane compound.

8. The device of claim 5 wherein said dielectric component comprises the sequential condensation products of bis-trichlorosilyloctane, octachlorotrisiloxane, 4-[[(4-(N,N,-bis((hydroxy)ethyl)amino]-phenyl]-1-(4-trichlorosilyl)benzyl-pyridinium iodide and octachlorotrisiloxane.

9. The device of claim 5 wherein said dielectric component comprises iterations of at least one of said condensation products.

10. The device of claim 1 wherein said semiconductor is selected from GaAs, InP, InAs, InSb and GaP compounds, doped GaAs, InP, InAs, InSb and GaP compounds and combinations thereof.

11. The device of claim 1 wherein said semiconductor is selected from GaAs, a doped GaAs compound and combinations thereof.

12. The device of claim 11 comprising a doped-GaAs channel component.

13. The device of claim 1 wherein said gate dielectric further comprises an inorganic dielectric component.

14. The device of claim 13 wherein said inorganic dielectric component is selected from $SiO_2$, $Si_3N_4$, $HfO_2$, $Al_2O_3$, $Ga_2O_3$, $Gd_2O_3$, $ZrO_2$ and $Ta_2O_5$ and combinations thereof.

15. The device of claim 1 wherein said device is a MISFET.

16. A metal-insulator-semiconductor field effect transistor device comprising a source, a drain, a gate positioned between said source and drain, a GaAs semiconductor and a gate dielectric comprising an organic dielectric component comprising a condensation product of at least two of a siloxane moiety, a bis(silyl)alkyl compound and a π-polarizable moiety.

17. The device of claim 16 wherein said dielectric component comprises a bis(silyl)alkyl compound coupled with silicon-oxygen bonds to a-π-polarizable moiety.

18. The device of claim 16 wherein said component comprises a siloxane moiety coupled to said π-polarizable moiety with silicon-oxygen bonds.

19. The device of claim 18 wherein each said silicon-oxygen bond is the condensation product of a hydrolyzable silicon moiety and a hydroxy functionality.

20. The device of claim 16 wherein said π-polarizable moiety comprises a non-linear optical chromophore.

21. The device of claim 20 wherein said chromophore comprises a stilbazolium ion.

22. The device of claim 16 wherein said gate dielectric further comprises an inorganic dielectric component.

23. The device of claim 22 wherein said inorganic dielectric component is selected from $SiO_2$, $Si_3N_4$, $HfO_2$, $Al_2O_3$, $Ga_2O_3$, $Gd_2O_3$, $ZrO_2$ and $Ta_2O_5$ and combinations thereof.

24. The device of claim 16 comprising at least one of an n-channel semiconductor and a p-channel semiconductor.

25. The device of claim 16 wherein said gate dielectric material has a thickness dimension between about 2 nm and about 20 nm.

* * * * *

UNITED STATES PATENT AND TRADEMARK OFFICE
CERTIFICATE OF CORRECTION

PATENT NO. : 7,633,130 B2
APPLICATION NO. : 11/725350
DATED : December 15, 2009
INVENTOR(S) : Tobin J. Marks et al.

It is certified that error appears in the above-identified patent and that said Letters Patent is hereby corrected as shown below:

Page 1, Column 1, Lines 9-10 "Grant Nos. NCC2-1363 and W911NF-05-0187 from NASA and DARPA/ARO" should be
--Grants Nos. NCC2-1363 and W911NF-05-1-0187 from NASA and DARPA/ARO--

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,633,130 B2 | Page 1 of 1 |
| APPLICATION NO. | : 11/725350 | |
| DATED | : December 15, 2009 | |
| INVENTOR(S) | : Tobin J. Marks et al. | |

It is certified that error appears in the above-identified patent and that said Letters Patent is hereby corrected as shown below:

Cover Page, Line (73):
  Additional Assignee
    --Purdue Research Foundation, West Lafayette, IN--

Signed and Sealed this

Nineteenth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,633,130 B2 | Page 1 of 1 |
| APPLICATION NO. | : 11/725350 | |
| DATED | : December 15, 2009 | |
| INVENTOR(S) | : Tobin J. Marks et al. | |

It is certified that error appears in the above-identified patent and that said Letters Patent is hereby corrected as shown below:

Col. 1, Lines 9-10:

"The United States Government has certain rights to this invention pursuant to Grant Nos. NCC2-3163 NCC2-1363 and W911NF-05-0187 from NASA and DARPA/ARO respectively, to Northwestern University."
should be:

--This invention was made with government support under grant number NCC-2-1363 awarded by the National Aeronautics Space Administration (NASA) and W911NF-05-1-0187 awarded by the Army Research Office (ARO). The government has certain rights in the invention.--

Signed and Sealed this
Nineteenth Day of March, 2013

Teresa Stanek Rea
*Acting Director of the United States Patent and Trademark Office*